LIMITING AMPLIFIER

Filed Oct. 23, 1965

INVENTOR
GERALD R. SCHRADER

BY Hurvitz & Rose

ATTORNEYS

United States Patent Office 3,468,324
Patented Sept. 23, 1969

3,468,324
LIMITING AMPLIFIER

Gerald R. Schrader, Adelphi, Md., assignor to Bowles Engineering Corporation, Silver Spring, Md., a corporation of Maryland Filed Oct. 23, 1965, Ser. No. 503,787
Int. Cl. F15c *1/12*
U.S. Cl. 137—81.5 10 Claims

ABSTRACT OF THE DISCLOSURE

A multi-stage pure fluid amplifier having a gain characteristic with a linear high grain portion and a sharply defined flat saturation portion, the amplifier comprising a plurality of cascaded pure fluid amplifier stages wherein the power stream pressures of each stage are individually adjusted such that the non-linear portions of the gain characteristic of each individual stage occur at input signal levels corresponding to low gain regions of the gain characteristic of the next succeeding stage whereby nonlinearities are substantially attenuated in the overall gain characteristic for the multi-stage amplifier.

The present invention relates generally to pure fluid amplifiers, and more particularly to high gain limiting multi-stage amplifiers wherein the limiting regions of successive stages are arranged to coincide by progressive selection of power nozzle pressures, so that all stages operate simultaneously over linear regions and all stages superpose their saturation regions.

In order to obtain high gain in the fluid amplifier art, it is commonly necessary to provide cascaded stages. To obtain linearity of the amplifier characteristic it is required that each amplifier stage operate linearly. It is desired, however, that the amplifier saturate at a predetermined level. To accomplish this, every stage must saturate at the same level of the amplifier input, or, otherwise stated, the amplifier stages must operate congruently having regard for the progressively increasing input signal levels appearing at succeeding stages. It is found that an analog fluid amplifier stage can be designed to provide a linear characteristic of input to ouput pressure, for a given power nozzle pressure, until a predetermined output level is reached. Thereafter, the presponse curve slope rather slowly changes to zero and thereafter becomes negative. The location of the transition of slope can be controlled in terms of power nozzle pressure in each stage. The transition for a stage, considered by itself, can be rather extended, but the transition for multiple stages in cascade can be made flat, by tailoring the rsponse of the several stages.

It is, accordingly, an object of the invention to provide a novel multi-stage analog fluid amplifier having high gain and a sharply defined saturation region.

It is another object of the invention to provide a novel high gain limiting amplifier of the pure fluid analog type.

A further object of the invention resides in the provision of a high gain multi-stage limiting amplifier of the pure fluid type, having provision for adjustment of the limiting point while retaining linearity of response until the limiting point is reached, the transition from linear amplification to limiting being well defined.

The above and still further objects, features and advantages of the present invention will become apparent upon consideration of the following detailed description of one specific embodiment thereof, especially when taken in conjunction with the accompanying drawing, wherein.

Figure 1:
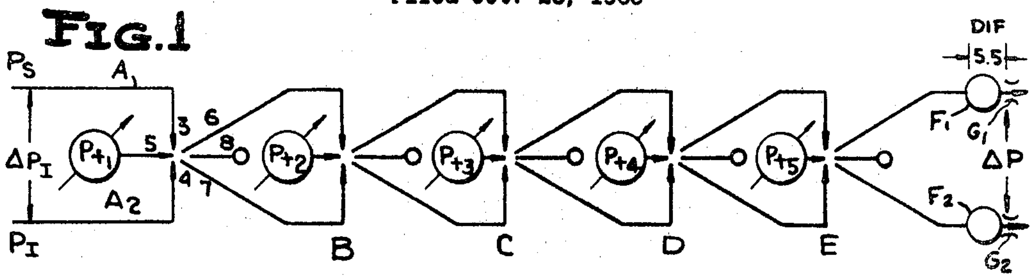
FIGURE 1 is a schematic circuit diagram of an amplifier according to the invention.

Referring now to FIGURE 1 of the accompanying drawings, A, B, C, D and E are successive cascaded stages of a multi-stage amplifier. Each of the stages is of the analog type, and each includes a separately adjustable source of fluid, applied to its power nozzle. For example, indicating the nozzles by the subscripts $P_1$ to $P_5$, inclusive, pressures may be scaled as follows: .6, .75, 1.5, 3, 9 p.s.i., for the respective nozzles, in the order recited. A differential pressure signal derived from an input transducer, of amplitude $\pm$.15 p.s.i. is applied to the input control lines $A_1$, $A_2$ for application to control nozzles $A_3$ and $A_4$. The fluid control signal supplied by the latter is applied to the jet supplied by nozzle $A_5$, which is deflected selectively and on an analog basis to output channels $A_6$ and $A_7$, channel $A_8$ serving to dump the jet in the no-signal condition. The output of channels $A_6$ and $A_7$ is supplied to further input channels $B_1$ and $B_2$, and in general the procedure is repeated throughout the amplifier, identical component elements of each stage being identically indentified in terms of subscript. The outputs of Stage E, at channels $E_6$ and $E_7$, are applied via tank $F_1$ and $F_2$ and constrictions $G_1$ and $G_2$, which together form a low pass filter, with cut-off at about 1 c.p.s. The constrictions may have a diameter of about .02" and the tank of about 5.5". For the above design, the differential pressure at the output transducer or load is $\pm$5 p.s.i. Noise level is about 2% of full scale.

Figure 2:
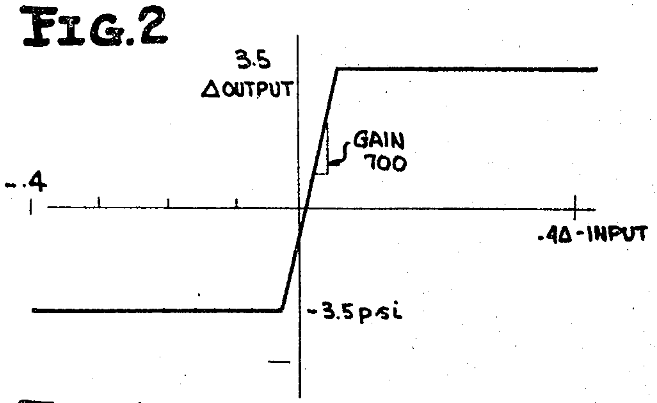
FIGURE 2 is a plot of a gain characteristic of the amplifier of FIGURE 1.

Referring to FIGURE 2, the output characteristic of the amplifier of FIGURE 1 is exhibited, gain being 700, linearity being excellent over the gain region, and a sharp transistion to saturation occurring followed by a flat saturation region.

Figure 3:
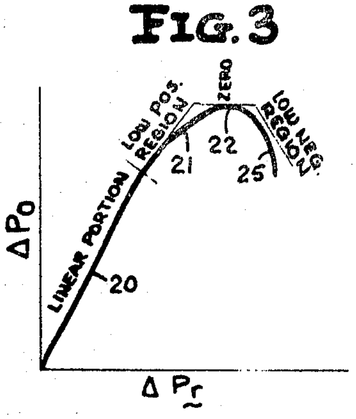
FIGURE 3 is a plot of a gain characteristic of a single stage of the amplifier of FIGURE 1.

In accordance with the invention, use is made of the fact that as input signal increases, FIGURE 3, the output signal initially rises linearly, as at 20, but eventually reaches a region of decreasing positive slope 21, which is succeeded by a point of zero slope 22, followed by a region of negative slope 25. The power nozzle pressures are adjusted so that the non-linear portion 21 of each preceding stage occurs at the low gain regions of the next succeeding stage. Thus the nonlinearities are effectively attentuated or at worst remain constant in the next stage. In addition to yielding a limiting characteristic by going over the "hump" of the velocity profile, smaller pressures P+ are required at the power nozzles to attain a saturation characteristic.

Figure 4:
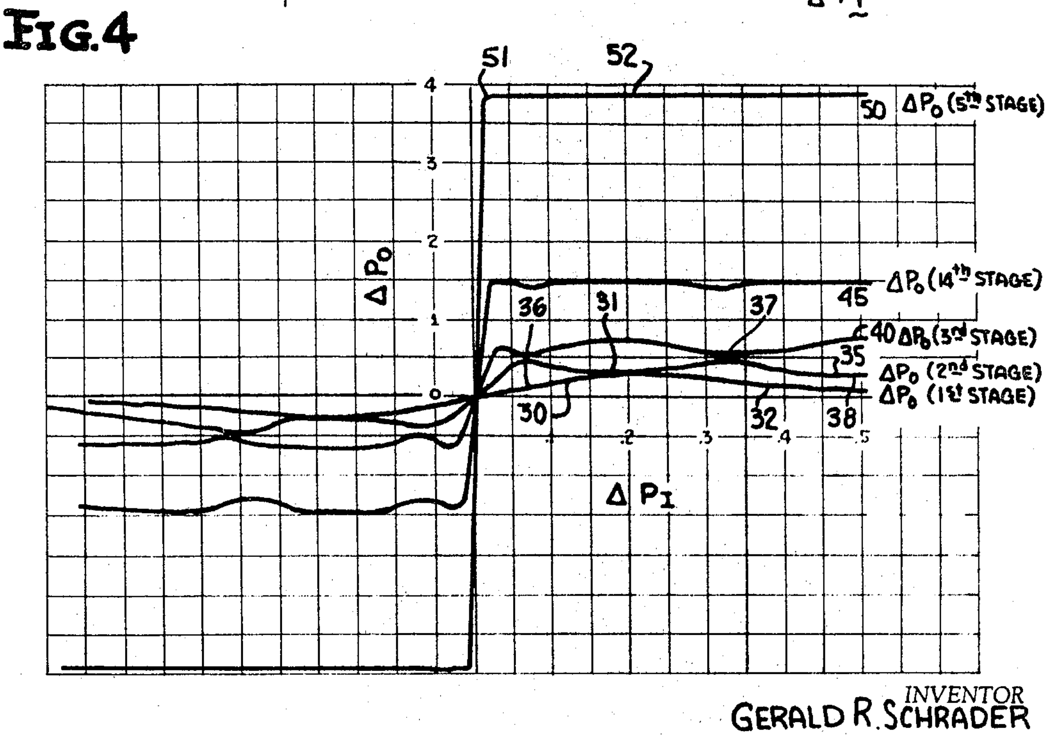
FIGURE 4 is a plot of $P_{in}$ to $P_{out}$ for each of the five stages of FIGURE 1.

Referring to FIGURE 4, plot 30 represents the output pressure at the first stage A. The hump 31 is evident, followed by a region of increasing slope 32. The stage B is driven from the signal represented by plot 30, providing characteristics 35. The linear portion 36 of characteristic 35 has an increased gain, a hump 37 and a flatter saturation region 38 than does characteristic 30.

The third stage characteristic 40 has a still higher gain, a still more sharply defined hump and a still flatter saturation region than does characteristic 35.

The fourth stage characteristic 45 and the fifth stage characteristic 50, are progressively improved, the latter being a sharp transition 51, and an almost perfectly flat saturation region 52.

Not only does the system of the invention provide a desirably shaped characteristic, but also the value of the limiting pressure can be readily selected. In the early stages of the amplifier, both sides of the complete velocity profile can be used to advantage. Operation according to the invention results in no sacrifice of gain, and in fact the linear range of the conventionally staged amplifier is increased.

What I claim is:

1. A multi-stage pure fluid analog limiting amplifier having a linear amplification characteristic and a flat limiting characteristic, comprising:
 a plurality of cascaded stages of analog amplification, each of said stages including a power nozzle and a source of fluid power connected to said power nozzle.
 means for adjusting the pressure at each of said nozzles independently of the pressure of the remaining nozzles in a generally ascending order of pressures in proceeding from stage to stage, each of said stages taken per se having an amplification characteristic including a linear portion, a portion of decreasing slope, a portion of zero slope and a portion of negative slope, said pressure being adjusted to so superpose the gain per stage that the final stage has, when said stages are cascaded, a linear region of amplification followed by a flat limiting region.

2. The combination according to claim 1 further comprising low-pass filter means connected in series with the output stage of said multi-stage amplifier.

3. A multi-stage pure fluid amplifier having an overall output pressure signal versus input pressure signal gain characteristic comprising a positive linear portion corresponding to input pressure signals below a predetermined pressure and a substantially flat zero-gain portion corresponding to input pressure signals above said predetermined pressure, said multi-stage amplifier comprising:
 a plurality of cascaded stages of pure fluid amplifier, each stage having a power nozzle, and each stage having an individual gain characteristic including a linear portion, a non-linear portion and a zero-gain portion;
 means for applying pressurized fluid to the power nozzles of said pure fluid amplifier stages;
 means for independently adjusting the pressure at each of said power nozzles such that the non-linear portion of the gain characteristic of each stage corresponds to the zero-gain portion of the gain characteristic of the next succeeding stage.

4. A multi-stage pure fluid amplifier having an output pressure versus input pressure characteristic comprising a region with substantially constant positive slope followed by a region with substantially zero slope, the two regions intersecting at a sharply defined transition point, said amplifier comprising:
 a plurality of cascaded pure fluid amplifier stages, each stage having a power nozzle, input means and output means, the output means of each stage being connected to the input means of the next succeeding stage;
 each of said stages having individual output pressure versus input pressure gain characteristics which have a relatively high gain region characterized by a substantially constant positive slope, a low gain region characterized by a substantially zero slope, and a transition region characterized by a slope which decreases gradually from the slope of said high gain region to the zero slope of said low gain region;
 means for applying pressurized fluid to the power nozzles of each stage;
 means for individually adjusting the fluid pressures at said power nozzles such that the power nozzle pressures at each stage are arranged in generally ascending order in proceeding from the first to last of said plurality of stages and such that the transition region between the high and low gain regions of the output pressure versus input pressure characteristic of each stage occurs for input signal pressures lying entirely within the low gain region of the output pressure versus input pressure characteristic of the next succeeding cascaded stage.

5. A multi-stage pure fluid amplifier comprising:
 a plurality of pure fluid amplifier stages, each stage having a power nozzle, input means and output means, each stage having a pressure gain characteristic relating the output pressure produced at said output means to an input pressure signal applied to said input means, the pressure gain characteristic of each of said stages being characterized by a first region of linear positive gain followed by a second region of non-linear positive gain, followed in turn by a third region of relatively low gain and in turn by a fourth region of negative gain;
 means for connecting said stages in cascade wherein the output means of each stage is connected to the input means of its respective next succeeding stage;
 means for applying pressurized fluid at individually adjustable pressures to each of said power nozzles such that the entire range of output pressures lying in said second, third, and fourth regions of the gain characteristics of each stage corresponds to a range of input pressures for the next succeeding stage which lies in the third and fourth regions of the gain characteristic of the latter, whereby the non-linearities of each individual stage are effectively attenuated in the overall gain characteristic of said multi-stage pure fluid amplifier.

6. The combination according to claim 5, further comprising low-pass filter means connected in series with the output stage of said multi-stage amplifier.

7. A multi-stage pure fluid amplifier having an output pressure versus input pressure characteristic comprising a region with substantially contant positive slope followed by a region with substantially zero slope, the two regions intersecting at a sharply defined transition point, said amplifier comprising:
 a plurality of cascaded pure fluid amplifier stages, each stage having a power nozzle, input means for receiving input signals and output means for providing output signals in response to said input signals, the output means of each stage being connected to the input means of the next succeeding stage;
 each of said stages having individual output signal versus input signal gain characteristics which have a substantially linear high gain portion followed by a nonlinear portion including a relatively low gain region;
 means for applying pressurized fluid to the power nozzle of each amplifier stage;
 means for individually adjusting the fluid pressures at said power nozzles in generally ascending order in proceeding from the first to the last of said plurality of amplifier stages such that for each stage output signals falling in the non-linear portion of the gain characteristic of that stage correspond to input signals falling in the low gain region of the next succeeding stage.

8. A multi-stage pure fluid amplifier comprising:
 a plurality of fluid amplifier stages, each stage having a power nozzle, input meansf or receiving a fluid input signal, and output means for providing a fluid output signal in response to said fluid input signal, each stage having a gain characteristic relating said output signal to said input signal, the gain characteristic of each stage being characterized by a first region of linear positive gain followed by a second region of non-linear gain, said second region including a portion of relatively low gain;
 means for connecting said stages in cascade wherein the output singal provided at the output means of each stage other than the last stage is applied as an input signal to the input means of the next succeeding cascaded stage;
 means for applying pressurized fluid at individually adjustable pressures to each of said power nozzles such that the pressure at the power nozzles are arranged in generally ascending order in proceeding from the first to the last of the cascaded stages and such that the output signals of each stage which fall within the second region of the gain characteristic of that stage correspond to input signals for the next succeeding stage which fall in the low gain portion of the non-linear region of the gain characteristic of said next succeeding stage;

whereby the non-linearities in the output signals of the individual amplifier stages are effectively attenuated in the overall output signal provided by the output means of the last cascaded stage of said multi-stage amplifier.

9. The combination according to claim 8 further comprising low-pass filter means connected in series with the output means of the last cascaded stage of said multistage amplifier.

10. A multi-stage pure fluid amplifier having an output pressure versus input pressure characteristic comprising a region with substantially constant positive slope followed by a region with substantially zero slope, the two regions intersecting at a sharply defined transition point, said amplifier comprising:

a plurality of cascaded pure fluid amplifier stages, each stage having a power nozzle, input means for receiving input signals and output means for providing output signals in response to said input signals, the output mean of each stage being connected to the input means of the next succeeding stage;

each of said stages having individual output pressure versus input pressure gain characteristic which have a substantially linear high gain portion followed by a nonlinear portion including a relatively low gain region;

means for applying pressurized fluid to the power nozzle of each amplifier stage;

means for individually adjusting the fluid pressures at said power nozzles in generally ascending order in proceeding from the first to the last of said plurality of amplifier stages such that for each stage output pressures falling in the non-linear portion of the gain characteristic of that stage correspond to input pressures falling in the low gain region of the next succeeding stage.

References Cited

UNITED STATES PATENTS 3,122,165 2/1964 Horton ------------ 137—81.5

OTHER REFERENCES

Van Tilburg, R. W., et al.; Development of a Proportional Fluid Amplifier for Multi Stage Operation, in Proceedings of the Fluid Amplification Symposium, vol. II, Harry Diamond Laboratories Army Materiel Command, Washington 25, D.C., May 1964 (pages 321–326 relied on).

M. CARY NELSON, Primary Examiner

W. R. CLINE, Assistant Examiner